United States Patent
Antonio et al.

(10) Patent No.: US 12,288,704 B2
(45) Date of Patent: Apr. 29, 2025

(54) METHODS AND APPARATUS FOR PROCESSING A SUBSTRATE

(71) Applicant: Applied Materials, Inc., Santa Clara, CA (US)

(72) Inventors: Ralph P. Antonio, Santa Clara, CA (US); Lee Guan Tay, Singapore (SG); Peter Lai, Santa Clara, CA (US); Sudhir R. Gondhalekar, Fremont, CA (US); Tzu-Fang Huang, San Jose, CA (US); Jeffrey Hudgens, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 350 days.

(21) Appl. No.: 17/989,980

(22) Filed: Nov. 18, 2022

(65) Prior Publication Data

US 2024/0170311 A1    May 23, 2024

(51) Int. Cl.
*H01L 21/67* (2006.01)
*B25J 9/16* (2006.01)
*B25J 11/00* (2006.01)
*B25J 13/08* (2006.01)
*B25J 19/02* (2006.01)
*G01S 17/89* (2020.01)
*H01L 21/677* (2006.01)

(52) U.S. Cl.
CPC ........ *H01L 21/67259* (2013.01); *B25J 9/161* (2013.01); *B25J 11/0095* (2013.01); *B25J 13/088* (2013.01); *B25J 19/021* (2013.01); *G01S 17/89* (2013.01); *H01L 21/67742* (2013.01)

(58) Field of Classification Search
CPC ........ H01L 21/67259; H01L 21/67742; G01S 17/89; B25J 9/161; B25J 11/0095; B25J 13/088; B25J 19/021
See application file for complete search history.

(56) References Cited

U.S. PATENT DOCUMENTS

| | | | |
|---|---|---|---|
| 4,728,193 A * | 3/1988 | Bartelt | G03F 9/7049 356/509 |
| 6,126,380 A | 10/2000 | Hillman | |
| 7,442,476 B2 * | 10/2008 | Best | H01L 24/83 257/E21.705 |
| 8,309,475 B2 | 11/2012 | Koelmel et al. | |
| 8,318,579 B1 * | 11/2012 | Wu | H01L 23/544 438/69 |
| 9,891,048 B2 * | 2/2018 | Park | G01B 11/245 |
| 10,222,474 B1 | 3/2019 | Raring et al. | |
| 11,460,576 B2 | 10/2022 | Guo et al. | |

(Continued)

*Primary Examiner* — Dalena Tran

(74) *Attorney, Agent, or Firm* — Moser Taboada

(57) ABSTRACT

Methods and apparatus for processing a substrate are provided herein. For example, an apparatus for processing a substrate comprises a transfer robot configured to position a substrate on a substrate support disposed within an interior of a processing chamber configured to process the substrate and a sensor disposed on the transfer robot, operably connected to a controller of the processing chamber, and configured with an angle of view to provide in-situ continuous closed loop feedback relating to spatial information of the interior of the processing chamber to the controller.

20 Claims, 3 Drawing Sheets

(56) References Cited

U.S. PATENT DOCUMENTS

| | | | |
|---|---|---|---|
| 11,782,411 B2* | 10/2023 | Zach | .................... H01L 21/681 700/121 |
| 2003/0230384 A1 | 12/2003 | Su et al. | |
| 2020/0365440 A1 | 11/2020 | Seddon et al. | |
| 2021/0151956 A1 | 5/2021 | Raring et al. | |
| 2023/0306679 A1* | 9/2023 | Stewart | ................... G06T 15/10 |

* cited by examiner

METHODS AND APPARATUS FOR PROCESSING A SUBSTRATE

FIELD

Embodiments of the disclosure generally relate to methods and apparatus for processing substrates, and for example, to methods and apparatus that use in-situ spatial recognition calibration systems.

BACKGROUND

Integrated tools configured for substrate processing are known. Typically, the integrated tool comprises one or more transfer robots (e.g., buffer chamber robot) configured to transfer a substrate to/from one or more processing chambers of the integrated tool. In some instances, a user needs to manually perform substrate hand-off calibrations to ensure that the buffer chamber robot places the substrate to a center of a processing chamber substrate support (e.g., a pedestal). Such an operation, however, requires specialized centering tools, calibration substrates, and jigs and/or clear lids to ensure production substrates don't break and are properly placed in various processing chamber locations, which, in turn, requires the user to take down the integrated tool for a substantial amount of time (e.g., six (6) or more hours), which can result in a decrease of substrate throughput and a decrease in overall productivity.

Therefore, the inventors describe herein improved methods and apparatus that use in-situ spatial recognition calibration systems.

SUMMARY

Methods and apparatus for processing a substrate are provided herein. In some embodiments, an apparatus for processing a substrate comprises a transfer robot configured to position a substrate on a substrate support disposed within an interior of a processing chamber configured to process the substrate and a sensor disposed on the transfer robot, operably connected to a controller of the processing chamber, and configured with an angle of view to provide in-situ continuous closed loop feedback relating to spatial information of the interior of the processing chamber to the controller.

In accordance with at least some embodiments, a method of processing a substrate comprises providing spatial information of an interior of a processing chamber to a controller using a sensor disposed on a transfer robot with an angle of view for providing in-situ continuous closed loop feedback to the controller and positioning a substrate on a substrate support disposed within an interior of the processing chamber using the spatial information.

In accordance with at least some embodiments, a non-transitory computer readable storage medium having instructions stored thereon that when executed by a processor, cause a method associated with a processing chamber having a transfer robot to be performed. The method comprises providing spatial information of an interior of a processing chamber to a controller using a sensor disposed on a transfer robot with an angle of view for providing in-situ continuous closed loop feedback to the controller and positioning a substrate on a substrate support disposed within an interior of the processing chamber using the spatial information.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
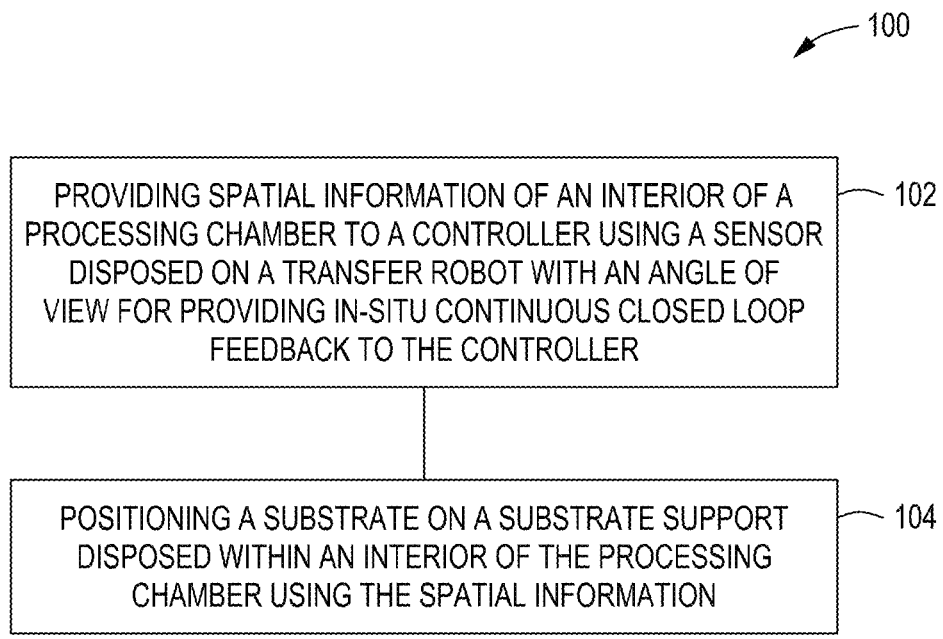
FIG. 1 is a flowchart of a method for processing a substrate, in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Methods and apparatus for processing a substrate are provided herein. For example, the methods and apparatus described herein use an automated substrate calibration system comprising one or more spatial recognition sensors (e.g., Lidar sensors (light detection and ranging)) to recognize, calculate, and adjust a placement of a substrate to a center of a processing chamber substrate support. For example, apparatus can comprise a transfer robot that is configured to position a substrate on a substrate support disposed within an interior of a processing chamber configured to process the substrate. A sensor disposed on the transfer robot and operably connected to a controller of the processing chamber can be configured with an angle of view to provide in-situ continuous closed loop feedback relating to spatial information of the interior of the processing chamber to the controller. The methods and apparatus described herein provide increased substrate throughput and an increase in overall productivity.

Figure 2:
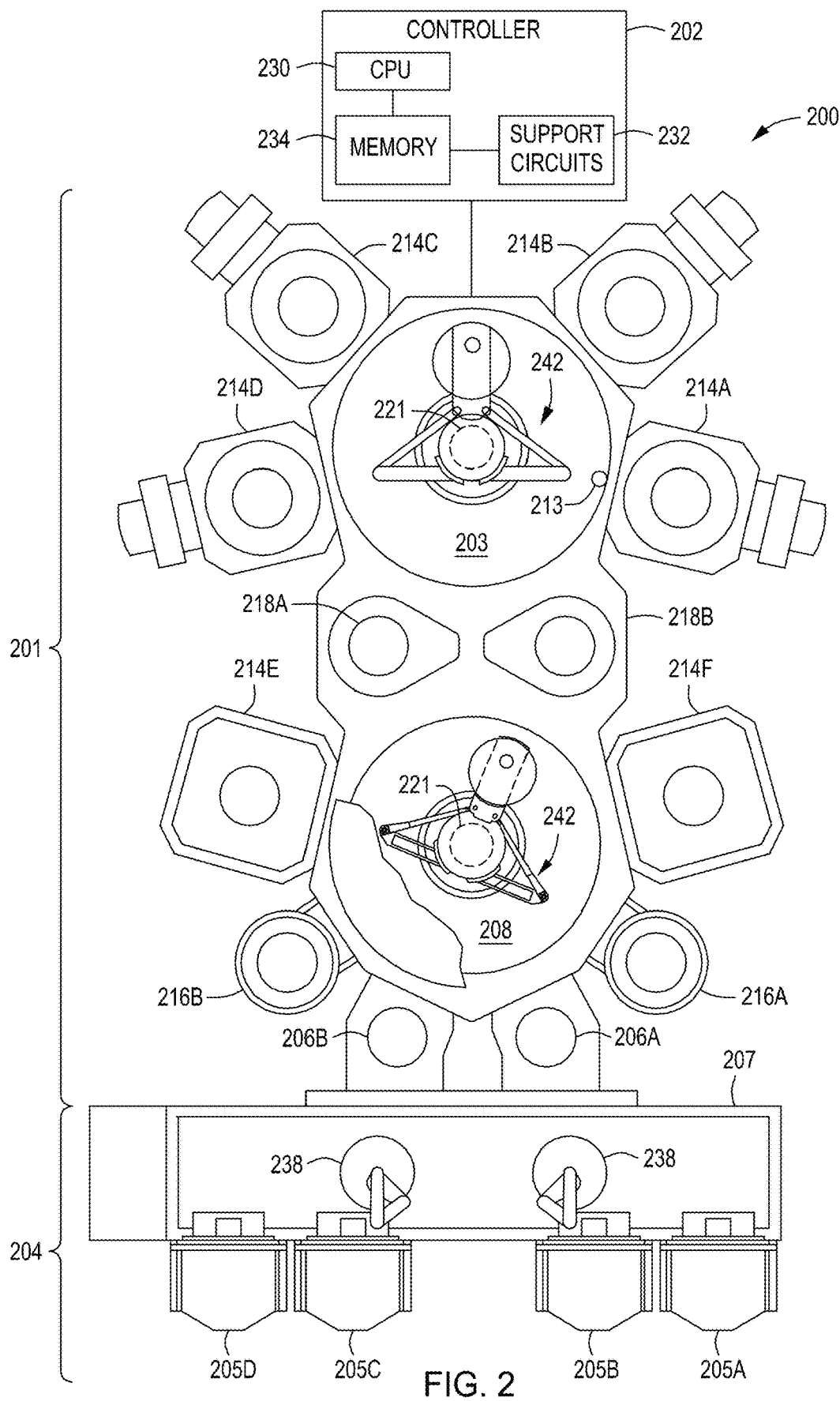
FIG. 2 is a diagram of an apparatus for performing the method of FIG. 1, in accordance with at least some embodiments of the present disclosure.

FIG. 1 is a flowchart of a method 100 for processing a substrate, and FIG. 2 is a tool 200 (or apparatus) that can used for carrying out the method 100, in accordance with at least some embodiments of the present disclosure.

The method 100 may be performed in the tool 200 which can include any suitable process chambers configured for one or more of physical vapor deposition (PVD), chemical vapor deposition (CVD), plasma enhanced CVD (PECVD), and/or atomic layer deposition (ALD), such as plasma enhanced ALD (PEALD), or thermal ALD (e.g., no plasma formation). Examples of processing systems that may be used to perform the inventive methods disclosed herein may include, but are not limited to, the one or more process chambers commercially available from Applied Materials, Inc., of Santa Clara, California. Other process chambers, including those from other manufacturers, may also be suitably used in connection with the teachings provided herein.

The tool 200 can be embodied in individual process chambers that may be provided in a standalone configuration or as part of a cluster tool, for example, an integrated tool (the tool 200) described below with respect to FIG. 2. Examples of the integrated tool can include, but are not limited to, the one or more process chambers commercially available from Applied Materials, Inc., of Santa Clara, California. The methods described herein may be practiced using other cluster tools having suitable process chambers coupled thereto, or in other suitable process chambers. For example, in some embodiments, the inventive methods discussed above may be performed in an integrated tool such that there are limited or no vacuum breaks between processing steps. For example, reduced vacuum breaks may limit or prevent contamination (e.g., oxidation) of one or more metal layers or other portions of the substrate.

The integrated tool includes a processing platform 201 (vacuum-tight processing platform), a factory interface 204, and a controller 202. The processing platform 201 comprises multiple process chambers, such as 214A, 214B, 214C, and 214D operatively coupled to a transfer chamber 203 (vacuum substrate transfer chamber) and process chambers 214E and 214F operatively coupled to a buffer chamber 208 (vacuum substrate buffer chamber).

The factory interface 204 is operatively coupled to the buffer chamber 208 by one or more load lock chambers (two load lock chambers, such 206A and 206B shown in FIG. 2). In at least some embodiments, one of the buffer chamber 208 or the transfer chamber 203 of the tool 200 can omitted. One or more modules or channels can be provided between the buffer chamber 208 and the transfer chamber 203 and can be configured to receive one or more substrates from the buffer chamber 208 and/or the transfer chamber 203. In at least some embodiments, a module 218A and a module 218B are provided between the buffer chamber 208 and the transfer chamber 203 and are configured to receive one or more substrates from the buffer chamber 208 and/or the transfer chamber 203 during operation, as will be described in greater detail below. As noted above, the module 218A and a module 218B can have transparent cover.

In some embodiments, the factory interface 204 comprises a docking station 207, a factory interface robot 238 to facilitate the transfer of one or more semiconductor substrates (wafers). The docking station 207 is configured to accept one or more front opening unified pod (FOUP). Four FOUPS, such as 205A, 205B, 205C, and 205D are shown in the embodiment of FIG. 2. The factory interface robot 238 is configured to transfer the substrates from the factory interface 204 to the processing platform 201 through the load lock chambers, such as 206A and 206B. Each of the load lock chambers 206A and 206B have a first port coupled to the factory interface 204 and a second port coupled to the transfer chamber 203. The load lock chambers 206A and 206B are coupled to a pressure control system (not shown) which pumps down and vents the load lock chambers 206A and 206B to facilitate passing the substrates between the vacuum environment of the buffer chamber 208 and the substantially ambient (e.g., atmospheric) environment of the factory interface 204. In at least some embodiments, the buffer chamber 208 can be maintained at a substantially ambient environment. In embodiments when the buffer chamber 208 is not used, the load lock chambers 206A and 206B facilitate passing the substrates between the transfer chamber 203 and the factory interface 204. The buffer chamber 208 and the transfer chamber 203 each have a vacuum robot 242 positioned to transfer/receive one or more substrates. For example, the vacuum robot 242 of the buffer chamber 208 is capable of receiving/transferring the substrates 221 between the load lock chambers 206A and 206B, the process chambers 214E and 214F, and the modules 218A and 218F. Similarly, the vacuum robot 242 of the transfer chamber 203 is capable of receiving/transferring the substrates 221 between the process chambers 214A, 214B, 214C, and 214D and the modules 218A and 218F.

In some embodiments, the process chambers 214A, 214B, 214C, 214D, 214E, and 214F can comprise at least an ALD chamber, a CVD chamber, a PVD chamber, an e-beam deposition chamber, and/or an electroplating, electroless (EEP) deposition chamber. Likewise, in some embodiments, one or more optional service chambers (shown as 216A and 216B) may be coupled to the buffer chamber 208. The service chambers 216A and 216B may be configured to perform other substrate processes, such as degassing, mask data preparation (MDP), bonding, chemical mechanical polishing (CMP), FEP, substrate cleaning (preclean), wafer cleaving, etching, plasma dicing, orientation, substrate metrology, cool down, and the like.

The controller 202 controls the operation of the tool 200 using a direct control of the process chambers 214A, 214B, 214C, 214D, 214E, and 214F, and the apparatus 212, or alternatively, by controlling the computers (or controllers) associated with the process chambers 214A, 214B, 214C, 214D, 214E, and 214F, the apparatus 212, and the tool 200. In operation, the controller 202 enables data collection and feedback from the respective chambers and systems to optimize performance of the tool 200. The controller 202 generally includes a central processing unit 230, a memory 234, and a support circuit 232. The central processing unit 230 may be any form of a general-purpose computer processor that can be used in an industrial setting. The support circuit 232 is conventionally coupled to the central processing unit 230 and may comprise a cache, clock circuits, input/output subsystems, power supplies, and the like. Software routines, such as processing methods as described above may be stored in the memory 234 (e.g., nontransitory computer readable storage medium having instructions stored thereon that when executed by a processor perform a method of processing a substrate) and, when executed by the central processing unit 230, transform the central processing unit 230 into a specific purpose computer (e.g., the controller 202). The software routines may also be stored and/or executed by a second controller (not shown) that is located remotely from the tool 200.

As noted above, the inventors have provided herein improved methods and apparatus that use in-situ spatial recognition calibration systems. For example, one or more sensors operably coupled to the controller via wired or wireless communication can be configured to create a 3D map of an interior of one or more the processing chamber (e.g., the process chambers 214A, 214B, 214C, and 214D, the modules 218A and 218F, and/or the service chambers 216A and 216B) under vacuum. In at least some embodiments, the one or more sensors can be attached to a wrist (or housing) of the vacuum robot 242 in the transfer chamber 203 or the buffer chamber 208. The one or more sensors can have an angled view of the substrate and/or a substrate (e.g., pedestal) heater through a slit valve of the processing chamber, as described in greater detail. The one or more sensors can be configured to map one or more internal processing chamber components, locate/position a substrate relative to the substrate heater center point, provide feedback offset to a substrate handling system (robotic system), and update robot blade extension/rotation automatically based on substrate to heater center point offset. In at least some embodiments, machine learning data provides continuous closed loop feedback to optimize and adjust the buffer chamber robot substrate placement (extension/rotation) into the center of the processing chamber, as opposed to conventional methods and apparatus that use calibration substrates, clear lids, special jigs and/or user (customer) engineer tooling.

Figure 3:
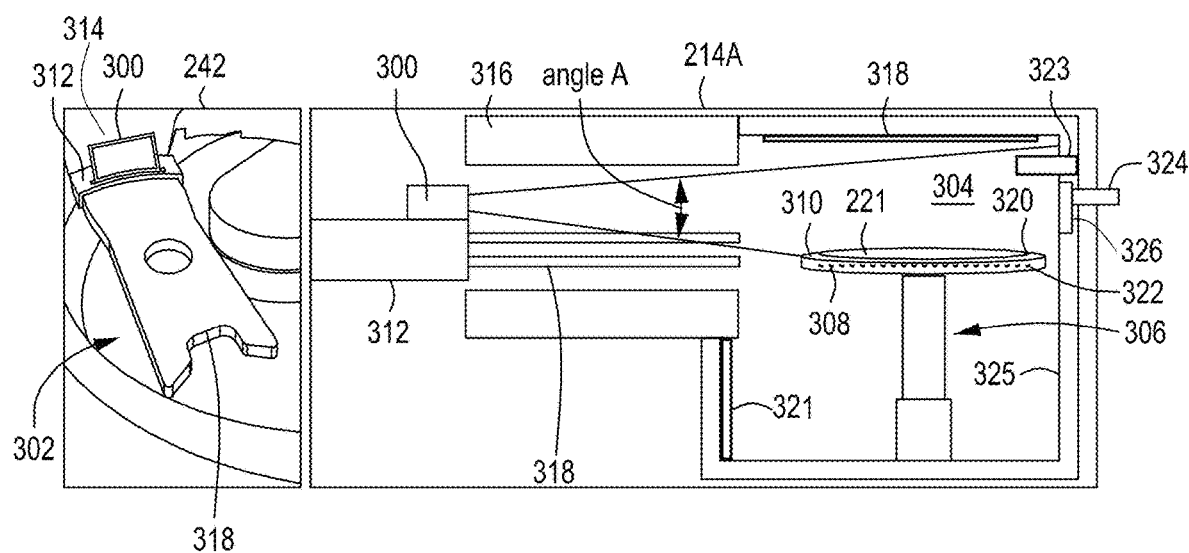
FIG. 3 is a diagram of a sensor on a robot arm as a substrate is being positioned within an interior of a processing chamber of the apparatus of FIG. 2, in accordance with at least some embodiments of the present disclosure.

For example, FIG. 3 is a diagram of a sensor 300 on a robot arm 302 (e.g., an arm of the vacuum robot 242 in the transfer chamber 203 and/or the buffer chamber 208) as a substrate (e.g., the substrate 221) is being positioned within an interior 304 of a processing chamber (e.g., the processing chamber 214A, for example) of the tool 200 of FIG. 2. For example, in at least some embodiments, the vacuum robot 242 (transfer robot) is configured to position the substrate 221 on a substrate support 306 disposed within the interior 304 of the processing chamber 214A that is configured to process the substrate 221. The substrate support 306 comprises a substrate support surface 310 and a heater 308 (e.g., an embedded electrode) that is disposed beneath the substrate support surface 310 and configured to heat the substrate 221 during operation. The substrate support 306 can also comprise one or more chucking devices (not shown) that can be configured as described in greater detail below.

The sensor 300 can be disposed on the vacuum robot 242, operably connected to the controller 202, and configured with an angle of view to provide in-situ continuous closed loop feedback to the controller 202. In at least some embodiments, the sensor 300 can be a light detection and ranging (Lidar) sensor. Suitable Lidar sensors that can be used for the sensor 300 can include, but are not limited to, the Velabit and/or the Velarray both available from Velodyne®, Inc., the Insight 1600 available from Insight®, Inc., and the AT128 available from Hesai®. The sensor 300 can be disposed on/attached to at least one of a wrist 312, which connects to a robot hand 315 that holds the substrate 221, of the robot arm 302 or a robot housing 314, e.g., a bracket that holds the wrist 312. The sensor 300 can be disposed on/attached to the robot hand 315 or the robot housing 314 using conventional methods/apparatus, such as, nuts, bolts, screws, clamps, adhesives, bonding, etc.

In operation, the sensor 300 is movable through a slit valve 316 of the processing chamber 214A when the vacuum robot 242 is positioning the substrate 221 onto the substrate support 306. As noted above, an angle of view (angle A, e.g., a full range of about 0 to about 180°) of the sensor 300 provides continuous closed loop feedback to the controller 202 for at least one of 3-D mapping internal components within the interior 304 of the processing chamber 214A or adjusting the robot arm 302 for positioning the substrate 221 on the substrate support 306. With this purpose in mind, the sensor 300 can be configured to determine spatial information within the interior 304 (e.g., using 3-D mapping). For example, the sensor 300 has an angle of view (angle A) that allows the sensor 300 to scan along an x-axis, a y-axis, and/or a z-axis to determine at least one of a distance between the substrate 221 and a faceplate 318 of a showerhead when PECVD (or other processes that use a showerhead) is being performed (or a target when PVD or other processes that use a target are being performed) of the processing chamber 214A, a distance between a substrate edge 320 and a heater edge 322 on the substrate support 306, or a distance between the substrate edge 320 and at least one of a chamber wall 325, a liner 321 (a portion of the liner 321 is shown), or a process kit 323 (a portion of the process kit 323) is shown each disposed within the interior 304 of the processing chamber 214A. A liner and process kit configured for use with the processing chambers and the inventive concepts described herein are described in commonly-owned U.S. Pat. No. 11,049,719, entitled "Epitaxy System Integrated With High Selectivity Oxide Removal And High Temperature Contaminant Removal."

In at least some embodiments, an optional second sensor can be used. For example, a second sensor 324, which also can be a Lidar sensor, can be operably connected to a view port 326 of the processing chamber, the controller 202, and configured with an angle of view for providing in-situ continuous closed loop feedback to the controller 202. In at least some embodiments, the angle of view can be the angle of view A or can be any angle of view that is capable of providing an adequate view of a lower portion (e.g., area between the substrate support surface 310 and the faceplate 318) of the interior 304 of the processing chamber 214A.

Continuing with reference to FIG. 1, initially one or more substrates may be loaded into one or more of the Four FOUPS, such as 205A, 205B, 205C, and 205D (FIG. 2). For example, in at least some embodiments, the substrate 221 (wafer) can be loaded into FOUP 205B. The substrate 221 can have a diameter of 150 mm, 200 mm, 300 mm, etc. The substrate 221 can be formed from germanium, silicon, silicon carbide, silicon oxide, etc. In at least some embodiments, the substrate 221 can have a 300 mm diameter and can formed from silicon. In at least some embodiments, one or more metal layers can be deposited on the substrate 221. For example, the one or more metal layers can comprise aluminum, cobalt, copper, nitride, titanium, tantalum, etc. In at least some embodiments, the substrate 221 can comprise a metal layer comprising cobalt and tungsten. Once loaded, the factory interface robot 238 can transfer the substrate 221 from the factory interface 204 to the processing platform 201 through, for example, the load lock chamber 206A. For example, the vacuum robot 242 can transfer the substrate 221 from the load lock chamber 206A to and from one or more of the process chambers 214A, 214B, 214C, 214D, 214E, and 214F and/or the service chambers 216A and 216B.

For example, in at least some embodiments, the vacuum robot 242 can transfer the substrate 221 from the load lock chamber 206A to the service chamber 216A where one or more of degassing, MDP, bonding, chemical mechanical polishing (CMP), substrate cleaning (preclean), wafer cleaving, etching, plasma dicing, orientation, FEP, substrate metrology, cool down can be performed. Similarly, the vacuum robot 242 can transfer the substrate 221 from the load lock chamber 206A to the processing chamber 214E where one or more of ALD, PEALD, CVD, PECVD, PVD, e-beam deposition, and/or an electroplating, electroless (EEP) deposition can be performed.

Next, at 102, the method 100 comprises providing spatial information of an interior of a processing chamber (e.g., the service chamber 216A or the processing chamber 214E) to a controller using a sensor disposed on a transfer robot with an angle of view for providing in-situ continuous closed loop feedback to the controller. For example, under the control of the controller 202, the method 100 can comprise moving the sensor 300 through the slit valve 316 when the transfer robot is positioning the substrate 221 on the substrate support 306. For example, the method 100 can comprise providing continuous closed loop feedback to the controller 202. As noted above, the continuous closed loop feedback can comprise at least one of mapping internal components within the interior 304 of the processing chamber 214E or adjusting the robot arm 302 (e.g., extend and/or rotate) for positioning the substrate 221 on the substrate support surface 310. In at least some embodiments, providing the continuous closed loop feedback to the controller 202 can comprise scanning along an x-axis, a y-axis, and a z-axis for determining at least one of a distance between the substrate and a faceplate of the processing chamber, a distance between the substrate edge and a heater edge on the substrate support, or a distance between the substrate edge and at least one of a chamber wall, a liner, or a process kit each disposed within the interior of the processing chamber.

Next, at 104, the method 100 comprises positioning a substrate on a substrate support disposed within an interior of the processing chamber using the spatial information. For example, using the spatial information (e.g., the 3-D mapping) from 102, the controller 202 can control the vacuum robot 242 to position a center of the substrate 221 at a center of the substrate support surface 310 so that the center of the substrate 221 is aligned with a center of the heater 308, e.g., based on a substrate to heater center point offset, which can have been previously determined. For example, in at least some embodiments, metrology data (uniformity data) can be stored in a server, e.g., a field service server (FSS), that collects all the data to utilize models, e.g., univariate analysis (UVA), that continuously adjust substrate placement in the processing chamber by correcting robot extension and rotation values (e.g., closed loop control). For example, in some embodiments, the method 100 can be based on a prediction of a machine learning process/artificial intelligence process, which can predict, based on a trend of previous and current spatial information, substrate to heater center point offset. For example, the spatial information of an interior of a processing chamber can be input into a trained machine learning model (e.g., which can be stored in the memory 234) that was previously trained from old data, and the output of the trained machine learning model can be used to center the substrate on the substrate support surface as described above. For example, in at least some embodiments, during 104 the method 100 can comprise extracting one or more features from the in-situ continuous closed loop feedback and providing the one or more features to a trained neural network for providing an output for optimizing and adjusting placement of the transfer robot into a center of the processing chamber. In a least some embodiments, the one or more features can comprise an x-axis, a y-axis, and a z-axis information for determining at least one of a distance between the substrate and a faceplate of the processing chamber, a distance between the substrate edge and a heater edge on the substrate support, or a distance between the substrate edge and at least one of a chamber wall, a liner, or a process kit each disposed within the interior of the processing chamber, as described above during 102. For example, collected data obtained can be input to the trained neural network and using the collected data the trained neural network can determine a predetermined center point on the substrate support surface and send the predetermined center point to the controller 202, which, in turn, can control the vacuum robot 242 for positioning the substrate 221 onto the substrate support surface 310 during operation. Once positioned, the controller 202 can communicate with a chucking electrode (an electrostatic chucking electrode not shown) disposed within/on the substrate support 306 to provide an electrostatic chucking force for maintaining the substrate 221 in a substantially fixed position during processing.

In at least some embodiments, such as when the second sensor 324 is used, the method 100 can comprise providing spatial information of the interior of the processing chamber using a second sensor operably coupled to a view port of the processing chamber and with an angle of view for providing in-situ continuous closed loop feedback to the controller. For example, during 104 the second sensor 324 can provide additional spatial information relating to the area between the substrate support surface 310 and the faceplate 318 to the controller 202 as the vacuum robot 242 is positioning the substrate 221 on the substrate support surface 310.

Next, the vacuum robot 242 of the buffer chamber 208 can transfer the substrate 221 from the service chamber 216A or the processing chamber 214A to one of the modules 218A and 2186 (e.g., for cool down). For example, after the substrate 221 has been processed, using the spatial information provided by the sensor 300 and/or the second sensor 324 the vacuum robot 242 can pick up the substrate in a conventional manner and transfer the substrate 221 from the interior of the service chamber 216A or the processing chamber 214A via the slit valve 316.

Next, the vacuum robot 242 of the transfer chamber 203 can transfer the substrate 221 from one of the modules 218A and 218B to one of the process chambers 214A, 214B, 214C, and 214D where one or more deposition processes may be performed on the substrate 221. In at least some embodiments, the substrate 221 can be transferred to the process chamber 214A using the method 100 where plasma enhanced chemical vapor deposition (PECVD) can be performed on the substrate 221, e.g., a film growth process.

While the foregoing is directed to embodiments of the present disclosure, other and further embodiments of the disclosure may be devised without departing from the basic scope thereof.

The invention claimed is:

1. An apparatus for processing a substrate, comprising:
a transfer robot configured to position a substrate on a substrate support disposed within an interior of a processing chamber configured to process the substrate; and
a sensor disposed on the transfer robot, operably connected to a controller of the processing chamber, and configured with an angle of view to provide in-situ continuous closed loop feedback relating to spatial information of the interior of the processing chamber to the controller.

2. The apparatus of claim 1, wherein the sensor is a light detection and ranging sensor.

3. The apparatus of claim 1, wherein the sensor is disposed on at least one of a wrist of a robot arm or a robot housing.

4. The apparatus of claim 3, wherein the sensor is movable through a slit valve of the processing chamber when the transfer robot is positioning the substrate on the substrate support.

5. The apparatus of claim 1, the angle of view provides continuous closed loop feedback to the controller for at least one of 3-D mapping internal components within the interior of the processing chamber or adjusting a robot arm for positioning the substrate on the substrate support.

6. The apparatus of claim 1, wherein the sensor is configured to scan along an x-axis, a y-axis, and a z-axis for determining at least one of a distance between the substrate and a faceplate of the processing chamber, a distance between a substrate edge and a heater edge on the substrate support, or a distance between the substrate edge and at least one of a chamber wall, a liner, or a process kit each disposed within the interior of the processing chamber.

7. The apparatus of claim 1, further comprising a second sensor operably coupled to a view port of the processing chamber, the controller of the apparatus, and configured with the angle of view for providing in-situ continuous closed loop feedback to the controller.

8. The apparatus of claim 7, wherein the second sensor is a light detection and ranging sensor.

9. The apparatus of claim 1, wherein the processing chamber is configured to process the substrate in a vacuum.

10. A method of processing a substrate, comprising:
   providing spatial information of an interior of a processing chamber to a controller using a sensor disposed on a transfer robot with an angle of view for providing in-situ continuous closed loop feedback to the controller; and
   positioning the substrate on a substrate support disposed within the interior of the processing chamber using the spatial information.

11. The method of claim 10, wherein the sensor is a light detection and ranging sensor.

12. The method of claim 10, wherein the sensor is disposed on at least one of a wrist of a robot arm or a robot housing.

13. The method of claim 12, further comprising moving the sensor through a slit valve of the processing chamber when the transfer robot is positioning the substrate on the substrate support.

14. The method of claim 10, further comprising providing continuous closed loop feedback to the controller comprising at least one of 3-D mapping internal components within the interior of the processing chamber or adjusting a robot arm for positioning the substrate on the substrate support.

15. The method of claim 10, further comprising scanning along an x-axis, a y-axis, and a z-axis for determining at least one of a distance between the substrate and a faceplate of the processing chamber, a distance between a substrate edge and a heater edge on the substrate support, or a distance between the substrate edge and at least one of a chamber wall, a liner, or a process kit each disposed within the interior of the processing chamber.

16. The method of claim 10, further comprising providing spatial information of the interior of the processing chamber using a second sensor operably coupled to a view port of the processing chamber and with an angle of view for providing in-situ continuous closed loop feedback to the controller.

17. The method of claim 16, wherein the second sensor is a light detection and ranging sensor.

18. The method of claim 10, wherein the processing chamber is configured to process the substrate in a vacuum.

19. The method of claim 10, wherein providing the spatial information of the interior of the processing chamber comprises:
   extracting one or more features from the in-situ continuous closed loop feedback; and
   providing the one or more features to a trained neural network, the trained neural network providing an output for optimizing and adjusting placement of the transfer robot into a center of the processing chamber.

20. A nontransitory computer readable storage medium having instructions stored thereon that when executed by a processor, cause a method associated with a processing chamber having a transfer robot to be performed, the method comprising:
   providing spatial information of an interior of the processing chamber to a controller using a sensor disposed on the transfer robot with an angle of view for providing in-situ continuous closed loop feedback to the controller; and
   positioning a substrate on a substrate support disposed within the interior of the processing chamber using the spatial information.

* * * * *